(12) United States Patent
Bieli et al.

(10) Patent No.: US 11,056,366 B2
(45) Date of Patent: Jul. 6, 2021

(54) SAMPLE TRANSPORT DEVICE WITH INTEGRATED METROLOGY

(71) Applicant: KLA-Tencor Corporation, Milpitas, CA (US)

(72) Inventors: Giampietro Bieli, Santa Clara, CA (US); Robert Tas, Aromas, CA (US); Kevin O'Brien, Menlo Park, CA (US); Shankar Krishnan, Santa Clara, CA (US); Joshua Butler, Meridian, ID (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/280,145

(22) Filed: Feb. 20, 2019

(65) Prior Publication Data

US 2019/0295874 A1     Sep. 26, 2019

Related U.S. Application Data

(60) Provisional application No. 62/647,540, filed on Mar. 23, 2018.

(51) Int. Cl.
*G01N 21/00*     (2006.01)
*H01L 21/67*     (2006.01)
(Continued)

(52) U.S. Cl.
CPC .... *H01L 21/67288* (2013.01); *G01B 11/0616* (2013.01); *G01J 3/447* (2013.01); *G01N 21/211* (2013.01); *G01N 21/55* (2013.01); *G01N 21/8806* (2013.01); *H01L 21/67253* (2013.01); *H01L 21/67772* (2013.01); *G01N 2021/213* (2013.01)

(58) Field of Classification Search
CPC . G01B 11/0616; G01B 2210/56; G01J 3/447; G01N 2021/213; G01N 21/211; G01N 21/55; G01N 21/8806; G01N 21/9501; H01L 21/67253; H01L 21/67288; H01L 21/67386; H01L 21/67772
See application file for complete search history.

(56) References Cited

U.S. PATENT DOCUMENTS 9,739,728 B1     8/2017  Bedell et al.
2003/0230384 A1  12/2003  Su et al.
(Continued)

OTHER PUBLICATIONS

International Search Report and Written Opinion dated Jun. 28, 2019 for PCT/US2019/023493.

*Primary Examiner* — Peter B Kim
(74) *Attorney, Agent, or Firm* — Suiter Swantz pc llo

(57) ABSTRACT

A metrology system may include one or more casings that fit within an interior cavity of a sample transport device, an illumination source within one of the one or more casings, one or more illumination optics within one of the one or more casings for directing illumination from the illumination source to a sample located in the interior cavity of the sample transport device, one or more collection optics within one of the one or more casings for light from the sample in response to the illumination from the illumination source, and one or more detectors within one of the one or more casings for generating metrology data based on at least a portion of the light collected by the one or more collection optics.

39 Claims, 4 Drawing Sheets

(51) Int. Cl.
*G01J 3/447* (2006.01)
*G01N 21/21* (2006.01)
*G01N 21/88* (2006.01)
*G01B 11/06* (2006.01)
*H01L 21/677* (2006.01)
*G01N 21/55* (2014.01)

(56) References Cited

U.S. PATENT DOCUMENTS

| | | |
|---|---|---|
| 2004/0224429 A1 | 11/2004 | Eyolfson et al. |
| 2011/0199476 A1* | 8/2011 | Ravid ................ G05B 19/4189 |
| | | 348/86 |
| 2014/0065731 A1 | 3/2014 | Allenic et al. |
| 2015/0124247 A1 | 5/2015 | Park et al. |
| 2016/0123898 A1* | 5/2016 | Chen ................ G01N 21/9501 |
| 2017/0372924 A1* | 12/2017 | Bello ................ H01L 21/6732 |

* cited by examiner

SAMPLE TRANSPORT DEVICE WITH INTEGRATED METROLOGY

CROSS-REFERENCE TO RELATED APPLICATION

The present application claims the benefit under 35 U.S.C. § 119(e) of U.S. Provisional Application Ser. No. 62/647,540 filed Mar. 23, 2018, entitled INTEGRATED METROLOGY FOUP, naming Robert Tas, Giampietro Bieli, Kevin O'Brien, Shankar Krishnan, and Josh Butler as inventors, which is incorporated herein by reference in the entirety.

TECHNICAL FIELD

The present disclosure relates generally to sample transport devices for semiconductor processing and, more particularly, to sample transport devices with integrated metrology.

BACKGROUND

Process flows in modern semiconductor device fabrication lines utilize a multitude of fabrication steps performed by a series of semiconductor fabrication tools. In some cases, process flows may contain more than 800 process steps in a re-entrant flow among a set of process tools including over one thousand equipment units of over one hundred different types. Wafers in a process flow are typically moved through the process steps in sealable sample transport devices, or front opening unified pods (FOUPs), by an automated material handling system (AMHS) or an overhead material handling system (OHS). For example, once a fabrication or metrology tool has received a FOUP, the FOUP may be opened in a controlled environment, processed, and returned to the FOUP for pickup. In this regard, the FOUP provides a clean and protective environment for the storage and transfer of samples in a process flow.

Further, process flows typically include sample metrology steps after one or more fabrication steps, which are typically performed on dedicated metrology tools. However, transport of the samples to and from the metrology tools for measurement decreases production throughput and may expose the samples to additional contamination risks. Therefore, it would be desirable to provide a system and method for curing defects such as those identified above.

SUMMARY

A metrology system is disclosed in accordance with one or more illustrative embodiments of the present disclosure. In one embodiment, the system includes one or more casings configured to fit within an interior cavity of a sample transport device. In another illustrative embodiment, the system includes an illumination source within one of the one or more casings. In another illustrative embodiment, the system includes one or more illumination optics within one of the one or more casings. In another illustrative embodiment, the one or more illuminating optics direct illumination from the illumination source to a sample located in the interior cavity of the sample transport device. In another illustrative embodiment, the system includes one or more collection optics within one of the one or more casings. In another illustrative embodiment, the one or more collection optics collect light from the sample in response to the illumination from the illumination source. In another illustrative embodiment, the system includes one or more detectors within one of the one or more casings. In another illustrative embodiment, the one or more detectors generate metrology data based on at least a portion of the light collected by the one or more collection optics.

A sample transport device is disclosed in accordance with one or more illustrative embodiments of the present disclosure. In one illustrative embodiment, the sample transport device includes an enclosure configured to mount to a loadport of at least one of a process tool or a buffer station. In another illustrative embodiment, the sample transport device includes one or more storage features within the enclosure for securing one or more samples in the enclosure. In another illustrative embodiment, the sample transport device includes one or more metrology tools within the interior cavity to generate metrology data for at least one of the one or more samples. In another illustrative embodiment, the sample transport device includes a data transmitter to transmit the metrology data from the one or more metrology tools.

A metrology method is disclosed in accordance with one or more illustrative embodiments of the present disclosure. In one illustrative embodiment, the method includes performing a process step on a sample with a process tool. In another illustrative embodiment, the method includes inserting the sample into a sample transport device. In another illustrative embodiment, the method includes generating metrology data for the sample with a metrology unit within the sample transport device. In another illustrative embodiment, the method includes controlling one or more control parameters of at least one of the process tool or an additional process tool based on the metrology data from the sample transport device.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
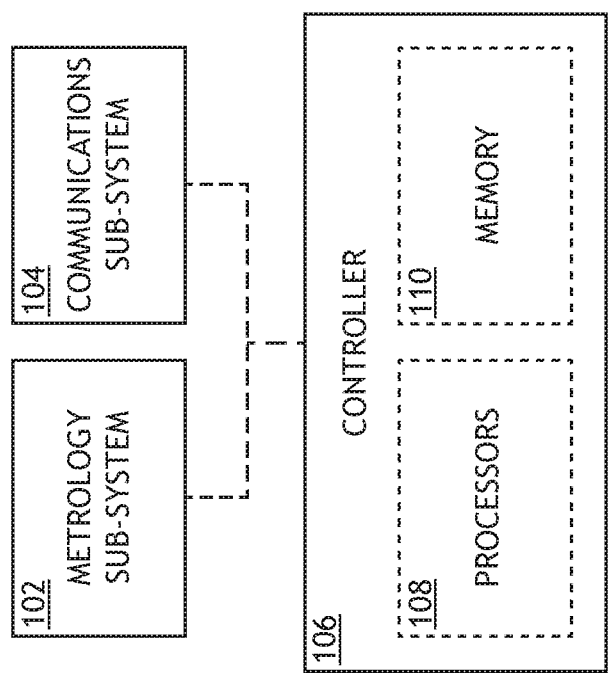
FIG. 1 is a conceptual view of an in-FOUP metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to performing metrology measurements of samples within a sample transport device (e.g., a FOUP) with one or more integrated metrology tools. In this regard, an in-FOUP metrology system may perform metrology measurements on samples within an interior portion of the FOUP. It is noted herein that sample transport device and Front Opening Unified Pod (FOUP) are used interchangeably for the purposes of the present disclosure.

It is recognized herein that semiconductor metrology is typically performed using dedicated metrology tools. Accordingly, samples must typically be transferred (e.g., by FOUPs) to and from the metrology tools in order to perform the associated metrology measurements, which may negatively impact the operational throughput. For example, a time cost associated with a measurement may include not only the time required by a metrology tool to perform a measurement, but also loading times of a sample into and out of a FOUP and transit times to and from the metrology tool. Accordingly, the frequency of measurements on a sample and/or the number of samples measured by a particular metrology tool may be determined by balancing the time cost associated with the measurement with the value (e.g., the utility) of the measurement. For this reason, metrology is typically limited to high-precision measurements associated with critical process steps.

Embodiments of the present disclosure are directed to performing metrology measurements of samples within a FOUP to reduce the time cost associated with metrology measurements. This reduced time cost may be exploited in many ways to increase the throughput and/or the performance of a semiconductor process flow. For example, in-FOUP metrology may replace metrology by one or more stand-alone metrology tools. In this regard, one or more metrology measurements may be performed between process steps without requiring a sample to be loaded into a stand-alone metrology tool, which may provide substantial time cost savings. By way of another example, in-FOUP metrology may supplement metrology with stand-alone metrology tools. In this regard, in-FOUP metrology may facilitate additional metrology measurements with minimal to no time cost. For instance, metrology measurements may be performed when a sample would otherwise be idle (e.g., when on a buffering station). By way of a further example, in-FOUP metrology may be used to ensure correlation of measurements from a stand-alone tool with measurements using a complementary technique.

In-FOUP metrology may additionally provide efficient screening and/or monitoring functions. For example, in-FOUP metrology may facilitate rapid screening of samples, which may supplement or replace additional metrology steps. For instance, in-FOUP metrology may be used to identify outliers and/or flag samples for additional measurements with a dedicated tool. By way of another example, in-FOUP metrology may facilitate monitoring of process tools for tool qualification, post-installation checks, fleet repeatability monitoring, tool-to-tool matching, or the like. Further, in-FOUP metrology may perform preventative maintenance (PM) by identifying process tools for inspection or repair.

Metrology tools (e.g., sub-systems of components suitable for performing metrology, storing results, transmitted associated data, or the like) may be integrated into a FOUP in multiple ways, in accordance with one or more embodiments of the present disclosure. In some embodiments, an in-FOUP metrology tool is structurally integrated into a FOUP. In this regard, a FOUP may be custom-designed to provide sample metrology measurements.

Additional embodiments are directed to an in-FOUP metrology tool having components sized to be inserted into a standardized FOUP. For example, a FOUP may typically include a multitude of fins suitable for securing samples. Accordingly, an in-FOUP metrology tool may have features sized to integrate with and be secured by the fins of a standardized FOUP. Further, in some embodiments, in-FOUP metrology tools providing different measurements may be interchangeably installed into FOUPS to provide desired measurements in a particular process flow. Further, a FOUP may include any number of in-FOUP metrology tools to perform any number of metrology measurements.

An in-FOUP metrology tool may incorporate multiple measurement techniques such as, but not limited to, optical imaging, reflectometry, spectroscopic reflectometry, ellipsometry, or spectroscopic ellipsometry measurements. Further, an in-FOUP metrology tool may provide any desired type of metrology measurement based on any combination of measurement techniques such as, but not limited to, sample imaging, characterization of film properties, parametric measurements, composition measurements, critical-dimensional (CD) determinations, or defect inspection. Such measurements may additionally be provided at any number of locations on the sample to provide location-based metrology.

In-FOUP metrology may be performed with a FOUP stationed at any suitable location. For example, in-FOUP metrology may be performed on a FOUP stationed on a dedicated metrology loadport, a loadport of any process tool, a buffer system, or the like. Further, in-FOUP metrology may be performed while a FOUP is stationary or in motion.

Metrology data generated by in-FOUP metrology may be provided to external components (e.g., an external controller) through multiple means. In some embodiments, an in-FOUP metrology tool includes a communications sub-system suitable for transmitting metrology data through any wired or wireless protocol. For example, an in-FOUP metrology tool may be configured to transmit data directly to an external controller as data is generated or at specified times. By way of another example, an in-FOUP metrology tool may be configured to transmit data to a dedicated receiver (e.g., a dedicated loadport), which may in turn provide the data to an external controller.

Referring now to FIGS. 1 through 4, systems and methods for in-FOUP metrology are described in greater detail.

FIG. 1 is a conceptual view of an in-FOUP metrology system 100, in accordance with one or more embodiments of the present disclosure.

In one embodiment, an in-FOUP metrology system 100 includes a metrology sub-system 102 for performing metrology on one or more samples. The metrology sub-system 102 may include any type of metrology system known in the art suitable for providing metrology signals associated with metrology targets on a sample. In one embodiment, the metrology sub-system 102 is configured to provide signals indicative of one or more optical properties of a metrology target (e.g., one or more dispersion parameters, and the like) at one or more wavelengths. For example, the metrology sub-system 102 may include, but is not limited to, a spectrometer, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer. In one embodiment, the metrology sub-system 102 includes an image-based metrology tool to measure metrology data based on the generation of one or more images of a sample.

In another embodiment, an in-FOUP metrology system 100 includes a communications sub-system 104 for communicating with components internal or external to a sample. For example, the communications sub-system 104 may receive inspection recipes for the metrology sub-system 102. By way of another example, the communications sub-system 104 may transmit metrology data generated by the metrology sub-system 102 to one or more additional components. The communications sub-system 104 may include components for providing communication using any combination of wired or wireless protocols known in the art such as, but not limited to, a WiFi protocol, a Bluetooth protocol, a Bluetooth Low Energy (BLE) protocol, or an ethernet protocol. For example, the communications sub-system 104 may include, but is not limited to, one or more antennas for transmitting and/or receiving data and one or more drivers for converting data to and/or from signals suitable for transmission or reception by the one or more antennas. By way of another example, the communications sub-system 104 may include circuitry for analyzing, encrypting/decrypting data, or otherwise processing data.

In another embodiment, the in-FOUP metrology system 100 includes a controller 106. In another embodiment, the controller 106 includes one or more processors 108 configured to execute program instructions maintained on a memory medium 110 (e.g., memory). In this regard, the one or more processors 108 of controller 106 may execute any of the various process steps described throughout the present disclosure. Further, the memory medium 110 may store any type of data for use by any component of the in-FOUP metrology system 100. For example, the memory medium 110 may store recipes for the metrology sub-system 102, metrology data generated by the metrology sub-system 102, or the like.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the in-FOUP metrology system 100, as described throughout the present disclosure. It is further recognized that the term "processor" may be broadly defined to encompass any device having one or more processing elements, which execute program instructions from a non-transitory memory medium 110.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random access memory, a magnetic or optical memory device (e.g., disk), a magnetic tape, a solid state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

Additionally, the controller 106 may include one or more controllers housed in a common housing or within multiple housings. Further, the controller 106 may be integrated and/or perform the functions of any components in the in-FOUP metrology system 100. For example, the communications sub-system 104 may be at least partially integrated into the controller 106 such that the controller 106 performs at least some of the operations of the communications sub-system 104 described herein. For instance, the controller 106 may perform tasks such as, but not limited to, analysis, encryption, decryption, or additional processing of data transmitted or received by the communications sub-system 104.

Metrology data generated by the in-FOUP metrology system 100 may be transferred to additional components or controllers after any process step. In one embodiment, metrology data is transmitted from the in-FOUP metrology system 100 in real-time as it is generated. In another embodiment, metrology data is transmitted from the in-FOUP metrology system 100 after one or more measurements are completed. In another embodiment, metrology data is transmitted from the in-FOUP metrology system 100 when the FOUP is placed in a selected location (e.g., a selected loadport). For example, a process line may include loadports (e.g., on selected process tools, buffer stations, standalone loadports, or the like) suitable for receiving or triggering data transfer from an in-FOUP metrology system 100. In one embodiment, one or more loadports include data reception systems (e.g., antennas, ethernet ports, or the like). Accordingly, placing a FOUP on the loadport (e.g., with an automated handling system) may trigger data transfer from the in-FOUP metrology system 100 to the loadport or an additional device.

The in-FOUP metrology system 100 may provide sample metrology within any type of sample transport device (e.g., FOUP). Further, the in-FOUP metrology system 100 may be integrated into a FOUP with any degree of permanence.

In one embodiment, an in-FOUP metrology system 100 includes a stand-alone unit that may be interchangeably inserted and/or removed into a FOUP. In this regard, the in-FOUP metrology system 100 may perform sample metrology within any type of FOUP. For example, the in-FOUP metrology system 100 may perform sample metrology within an off-the-shelf FOUP, a custom FOUP, or the like.

An in-FOUP metrology system 100 may be configured to include any number of instances of internal components such as, but not limited to, the metrology sub-system 102 or the communications sub-system 104. For example, an in-FOUP metrology system 100 may include any number of metrology sub-systems 102 for performing measurements on any number of samples within a FOUP. Further, multiple metrology sub-systems 102 may perform, but are not required to perform, different types of measurements such as, but not limited to, images, reflectivity measurements of any type, or ellipsometry measurements of any type. In this regard, the in-FOUP metrology system 100 may provide shared resources for the metrology sub-systems 102. For instance, the memory medium 110 may store recipes and/or metrology data associated with the multiple metrology sub-systems 102, the communications sub-system 104 may transmit and/or receive metrology data associated with the multiple metrology sub-systems 102, or the like.

By way of another example, an in-FOUP metrology system 100 may include multiple communications sub-systems 104. In one instance, an in-FOUP metrology system 100 may contain a dedicated communications sub-system 104 for one or more metrology sub-systems 102. In this regard, data associated with different metrology sub-systems 102 may be directed to different external components. In another instance, an in-FOUP metrology system 100 may contain different communications sub-systems 104 for communication via different protocols.

Further, any number of in-FOUP metrology systems 100 may be integrated into a single FOUP. For example, a FOUP may include one, two, three, or more in-FOUP metrology systems 100 for performing measurements on any number of samples.

Figure 2:
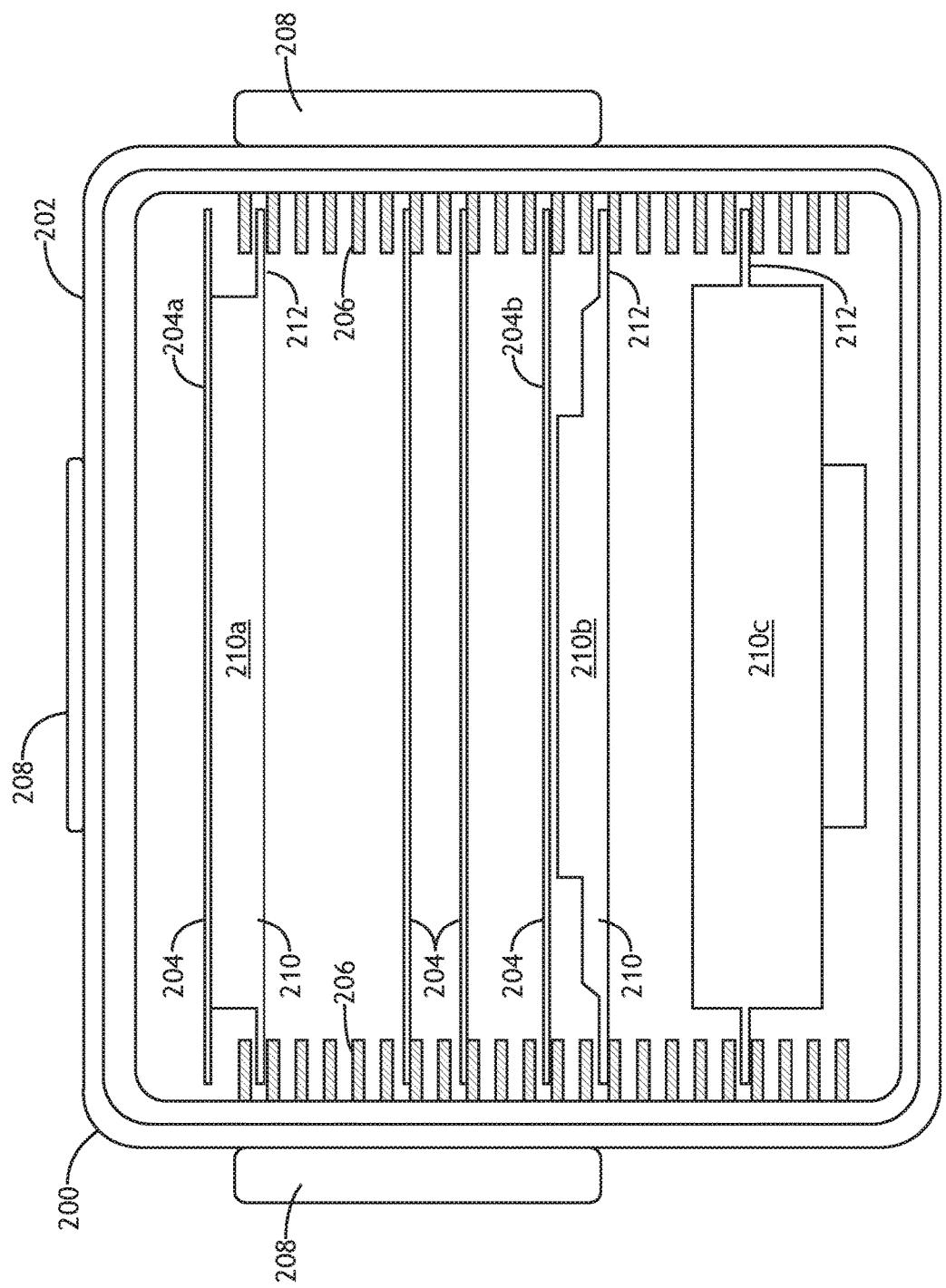
FIG. 2 is a profile view of an in-FOUP metrology system having one or more interchangeable components for insertion into a FOUP, in accordance with one or more embodiments of the present disclosure.

FIG. 2 is a profile view of an in-FOUP metrology system 100 having one or more interchangeable components for insertion into a FOUP 200, in accordance with one or more embodiments of the present disclosure. In one embodiment, a FOUP 200 includes an enclosure 202 providing an enclosure for one or more samples 204. The FOUP 200 may thus provide a protective environment for transport of the samples 204. The FOUP 200 may further provide a clean environment in which the atmosphere and particulates are controlled.

In another embodiment, the FOUP 200 includes one or more storage features 206 suitable for securing items such as, but not limited to, samples 204. A FOUP 200 may incorporate any type of storage features 206 known in the art such as, but not limited to slots, racks, or fins. Further, the storage features 206 may contact any portion of the samples 204. For example, as illustrated in FIG. 2, the FOUP 200 includes storage features 206 that contact only edge portions of samples 204.

In another embodiment, the FOUP 200 includes one or more coupling features 208 (e.g., on the enclosure 202) for coupling to additional components such as, but not limited to, an automated handling system, a loadport of a tool, or a loadport of a buffer station.

In one embodiment, an in-FOUP metrology system 100 includes at least one casing 210 for enclosing and securing internal components. For example, the in-FOUP metrology system 100 illustrated in FIG. 2 includes a first casing 210a, a second casing 210b, and a third casing 210c for securing various associated components. In one embodiment, the first casing 210a includes a first metrology sub-system 102 for performing metrology measurements of a first sample 204a and a second casing 210b includes a second metrology sub-system 102 for performing metrology measurements of a second sample 204b. The third casing 210c may include any additional components of the in-FOUP metrology system 100 such as, but not limited to, the communications sub-system 104 or at least a portion of the memory medium 110. Additionally, the in-FOUP metrology system 100 may include a controller 106 distributed between any combination of the casings 210a-c.

It is to be understood, however, that an in-FOUP metrology system 100 may generally have any size, shape, or number of components (e.g., casings 210) suitable for integrating with a FOUP 200 and performing metrology measurements on at least one sample 204 within a FOUP 200. Further, the relative size of a casing 210 may depend on the type of measurements to be performed and the associated components contained within the casing 210. For example, the third casing 210c is shown in FIG. 2 as having a different size than the first and second casings 210a-b.

An in-FOUP metrology system 100 may be integrated with a FOUP with any level of permanence. In one embodiment, as illustrated in FIG. 2, an in-FOUP metrology system 100 may include one or more casing coupling features 212 sized and positioned to integrate with or otherwise couple to the storage features 206 of the FOUP 200. In this regard, a casing 210 may be independent from any particular FOUP 200 and may be selectively inserted or removed from any suitable FOUP 200. An in-FOUP metrology system 100, or portions thereof, may thus be sized to couple with the storage features 206 to secure the casing 210 within the FOUP 200. A casing 210 including the casing coupling features 212 may thus be selectively positioned at any suitable location within a FOUP 200. In another embodiment, though not shown, an in-FOUP metrology system 100 is permanently integrated into a FOUP. In this regard, a FOUP may include various components of the in-FOUP metrology system 100 to provide metrology on samples 204 within the FOUP.

An in-FOUP metrology system 100 may be placed at any distance from a sample to be characterized. In one embodiment, a sample is in direct contact with an in-FOUP metrology system 100 during a measurement. The sample may be placed in contact with a component of the in-FOUP metrology system 100 directly by any method. In one instance, the sample may be placed in contact with the in-FOUP metrology system 100 by a material handling system. For example, the first sample 204a is shown as directly placed on the first casing 210a. In another instance, though not shown, the in-FOUP metrology system 100 may include an adjustable stage to make contact with a sample secured by the storage features 206. In another embodiment, as illustrated in FIG. 2, the second sample 204b is physically separated from the in-FOUP metrology system 100 for a contactless measurement. For example, the second sample 204b is located on a different storage feature 206 (e.g., a different slot, shelf, fin, or the like) than the second casing 210b. In this regard, the separation distance between the first casing 210a and the first sample 204a may be based at least in part on the number and size of storage features 206 between them. Further, the in-FOUP metrology system 100 may include one or more adjustable components to adjust the distance to a sample (e.g., samples 204a-b).

Figure 3:
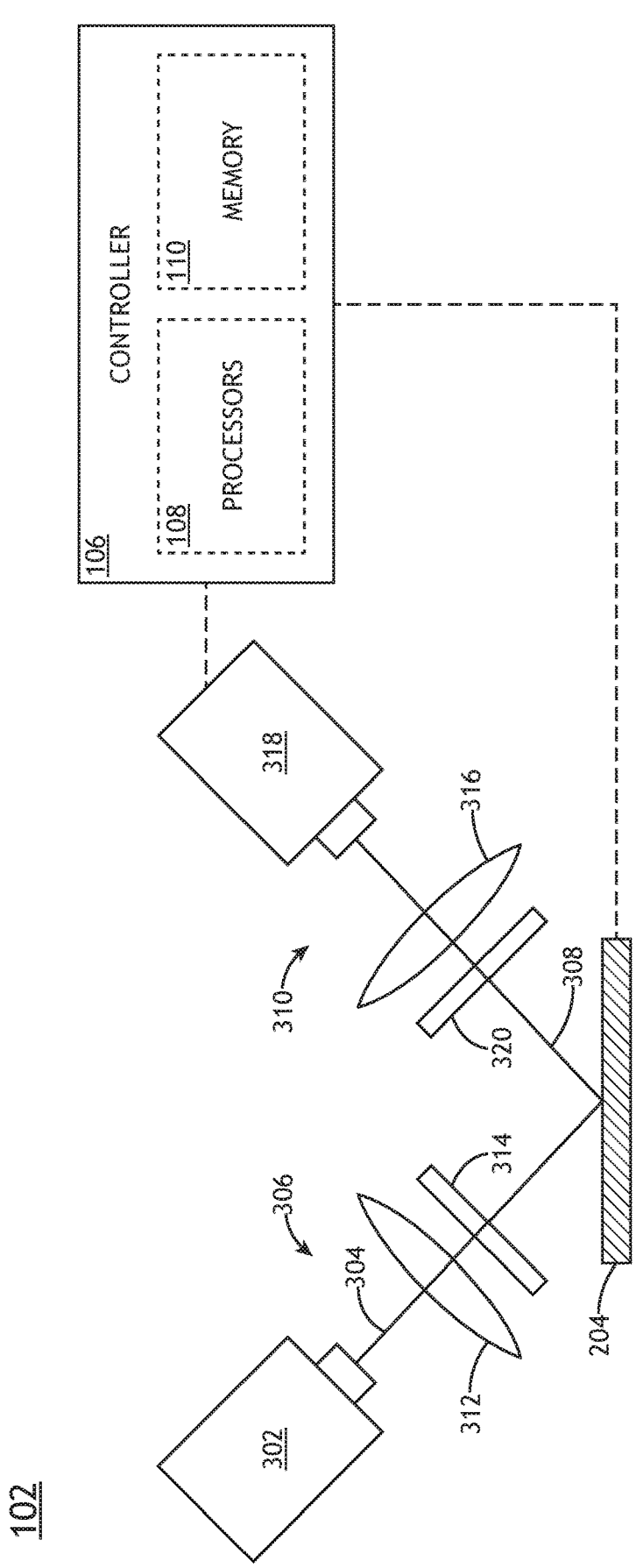
FIG. 3 is a conceptual view of a metrology sub-system, in accordance with one or more embodiments of the present disclosure.

Referring now to FIG. 3, a conceptual view of a metrology sub-system 102 is shown in accordance with one or more embodiments of the present disclosure. For example, components of the metrology sub-system 102 may be incorporated into one or more casings 210 of the in-FOUP metrology system 100 or directly integrated into a FOUP (e.g., the FOUP 200 illustrated in FIG. 2).

In one embodiment, the metrology sub-system 102 includes an illumination source 302 to generate an illumination beam 304. The illumination beam 304 may include one or more selected wavelengths of light including, but not limited to, ultraviolet (UV) radiation, visible radiation, or infrared (IR) radiation.

In one embodiment, the illumination source 302 includes a laser source. For example, the illumination source 302 may include, but is not limited to, one or more narrowband laser sources, one or more broadband laser sources, one or more supercontinuum laser sources, one or more white light laser sources, or the like. Further, the illumination source 302 may include any type of laser source known in the art including, but not limited to, a diode laser source or a diode-pumped laser source. In another embodiment, the illumination source 302 includes a lamp source. By way of another example, the illumination source 302 may include, but is not limited to, an arc lamp, a discharge lamp, an electrode-less lamp, and the like. In this regard, the illumination source 302 may provide an illumination beam 304 having low coherence (e.g., low spatial coherence and/or temporal coherence).

In another embodiment, the illumination source 302 provides a tunable illumination beam 304. For example, the illumination source 302 may include a tunable source of illumination (e.g., one or more tunable lasers, and the like). By way of another example, the illumination source 302 may include a broadband illumination source coupled to a tunable filter.

The illumination source 302 may further provide an illumination beam 304 having any temporal profile. For example, the illumination beam 304 may have a continuous temporal profile, a modulated temporal profile, a pulsed temporal profile, or the like.

In another embodiment, the illumination source 302 directs the illumination beam 304 to a sample 204 via an illumination pathway 306 and collects light emanating from the sample (e.g., collected light 308) via a collection pathway 310. The collected light 308 may include any combination of light from the sample 204 generated in response to the incident illumination beam 304 such as, but not limited to, reflected light, scattered light, diffracted light, or luminescence of the sample 204.

In one embodiment, the illumination pathway 306 may include an illumination focusing element 312 to focus the illumination beam 304 onto the sample 204. The illumination pathway 306 may include one or more illumination beam conditioning components 314 suitable for modifying and/or conditioning the illumination beam 304. For example, the one or more illumination beam conditioning components 314 may include, but are not limited to, one or more polarizers, one or more filters, one or more beam splitters, one or more apodizers, or one or more beam shapers, one or more diffusers, one or more homogenizers, or one or more lenses.

In another embodiment, the collection pathway 310 may include a collection focusing element 316 to capture the collected light 308 from the sample 204. In another embodiment, though not shown, the metrology sub-system 102 includes a beamsplitter oriented such that an objective lens may simultaneously direct the illumination beam 304 to the sample 204 and capture the collected light 308 emanating from the sample 204.

In another embodiment, the in-FOUP metrology system 100 includes a detector 318 configured to detect at least a portion of the collected light 308 emanating from the sample 204 through the collection pathway 310. The detector 318 may include any type of optical detector known in the art suitable for measuring illumination received from the sample 204. For example, a detector 318 may include, but is not limited to, a CCD detector, a CMOS detector, a TDI detector, a photomultiplier tube (PMT), an avalanche photodiode (APD), and the like. In another embodiment, a detector 318 may include a spectroscopic detector suitable for identifying wavelengths of radiation emanating from the sample 204.

The collection pathway 310 may further include any number of collection beam conditioning elements 320 to direct and/or modify illumination collected by the collection focusing element 316 including, but not limited to one or more lenses, one or more filters, one or more polarizers, or one or more phase plates.

In another embodiment, the metrology sub-system 102 depicted in FIG. 3 may facilitate multi-angle illumination of the sample 204, and/or more than one illumination source 302 (e.g., coupled to one or more additional detectors 318). In this regard, the metrology sub-system 102 depicted in FIG. 3 may perform multiple metrology measurements. In another embodiment, the metrology sub-system 102 may include multiple detectors 318 to facilitate multiple metrology measurements (e.g., multiple metrology tools) by the metrology sub-system 102. The sample 204 may include multiple metrology sub-systems 102 (e.g., in a single casing 210 or multiple casings 210). In another embodiment, the metrology sub-system 102 may include components suitable for providing multiple metrology types of measurements.

In another embodiment, though not shown, at least some of the components of the metrology sub-system 102 are adjustable. For example, one or more components of the metrology sub-system 102 may be adjustable to provide alignment to a sample 204 located at a given location within a FOUP (e.g., FOUP 200). By way of another example, one or more components of the metrology sub-system 102 may be adjustable to provide alignment to a selected location on the sample 204.

In one embodiment, the metrology sub-system 102 includes an imaging tool. For example, the detector 318 may include a multi-pixel detection device such as, but not limited to, a CCD detector, a CMOS detector, or a TDI detector. Further, the detector 318 may provide images at any selected resolution or color format. For example, the detector 318 may generate binary images, grayscale images, or full-color images with any color map (e.g., RGB, CMYK, or the like).

The metrology sub-system 102 may generate any type of image associated with the collected light 308 from the sample 204. In one embodiment, the metrology sub-system 102 generates one or more images of a surface and/or sub-surface layer of sample 204. For example, the metrology sub-system 102 may generate one or more images of an unprocessed sample 204. By way of another example, the metrology sub-system 102 may generate one or more images of features fabricated on one or more layers of a sample 204. In another embodiment, the metrology sub-system 102 generates one or more images of a pupil plane. In this regard, the metrology sub-system 102 may characterize the angles at which the collected light 308 emanates from the sample 204.

Further, the metrology sub-system 102 (e.g., via the controller 106) may stitch together images of different locations on the sample 204 to generate one or more composite images. In this regard, the metrology sub-system 102 may image any selected portion or portions of the sample 204. In one embodiment, the metrology sub-system 102 images an entire surface of the sample 204 (or an active area of the sample 204 including fabricated features). In another embodiment, the metrology sub-system 102 images a selected portion of the sample 204. It is recognized herein that the acquisition time of a measurement (and the associated throughput) of the metrology sub-system 102 may represent a tradeoff between factors such as, but not limited to, the spatial extent of the sample 204 that is imaged, the image resolution, the image quality, or the like. Accordingly, the metrology sub-system 102 may be adjusted to provide a desired balance of these factors.

The metrology sub-system 102 may generate images using any imaging technique known in the art such as, but not limited to, bright-field imaging, dark-field imaging, phase-contrast imaging, differential interference contrast imaging, or Nomarski imaging. Accordingly, the metrology sub-system 102 may provide any selected combination of apertures, phase plates, polarizers, and the like in any combination of the illumination pathway 306 or the collection pathway 310 to provide images using any selected imaging technique.

In another embodiment, the metrology sub-system 102 includes a reflectometry and/or an ellipsometry tool to characterize a sample 204 based on the reflection of light of any wavelength or combination of wavelengths by the sample 204. In this regard, the metrology sub-system 102 may include any combination of spectral filters, polarizers, phase plates, or compensators to perform any selected measurement including, but not limited to, single-wavelength reflectometry, spectral reflectometry, angle-resolved reflectometry, single-wavelength ellipsometry, spectral ellipsometry, or angle-resolved ellipsometry.

In another embodiment, the metrology sub-system 102 (e.g., via the controller 106) utilizes any combination of metrology techniques to generate data associated with the sample 204. Further, such data may be generated at multiple locations across the sample 204. For example, the metrology sub-system 102 may utilize one or more metrology techniques to characterize optical properties and/or composition information of one or more film layers. By way of another example, the metrology sub-system 102 may utilize one or more metrology techniques to measure sizes, shapes, and/or orientations of fabricated features on one or more layers. For instance, the metrology sub-system 102 may perform critical dimension (CD) metrology. By way of a further example, the metrology sub-system 102 may utilize one or more metrology techniques to detect and/or classify one or more defects on a processed or unprocessed sample 204.

Figure 4:
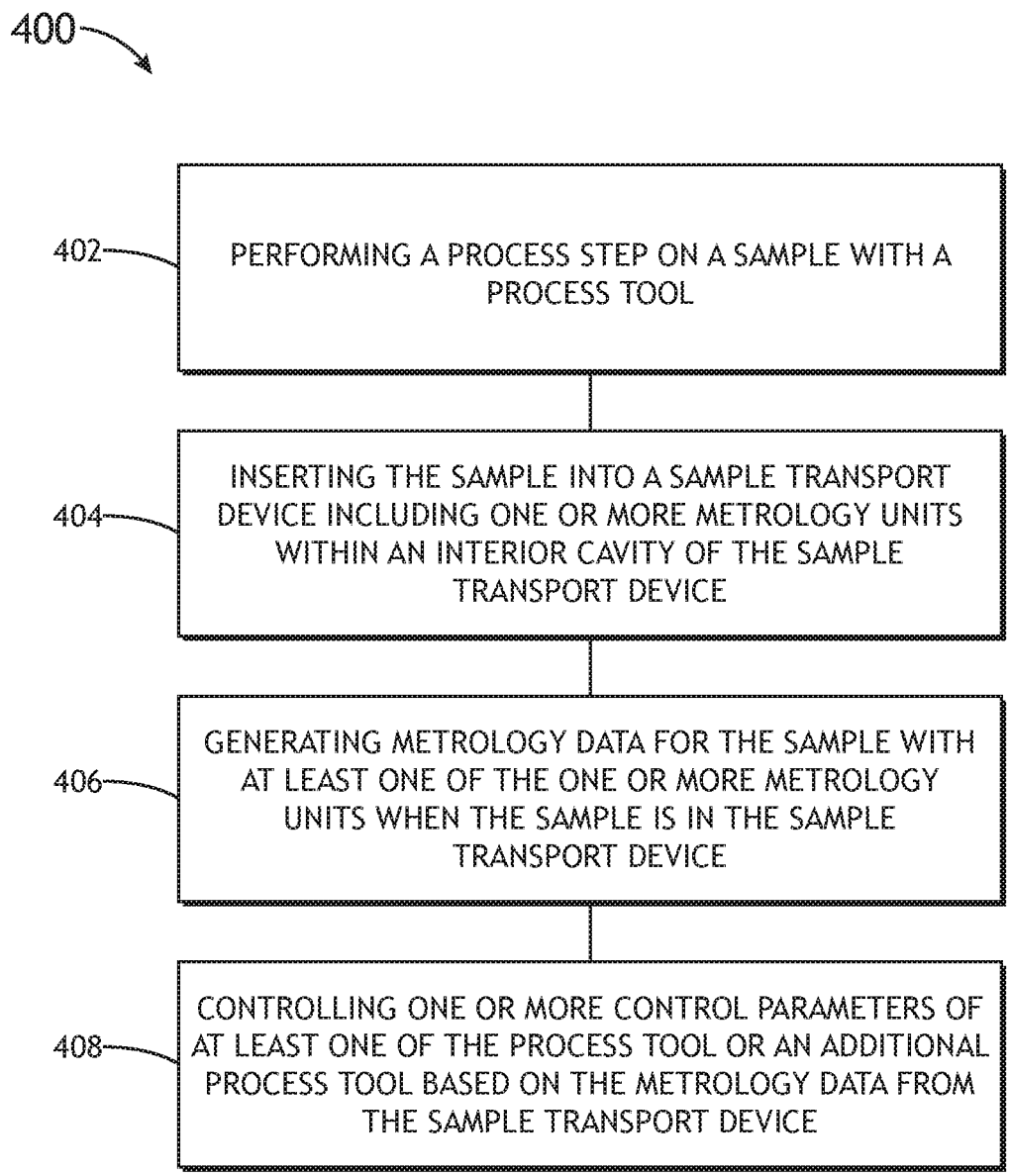
FIG. 4 is a flow diagram illustrating steps performed in a method for in-FOUP metrology, in accordance with one or more embodiments of the present disclosure.

FIG. 4 is a flow diagram illustrating steps performed in a method 400 for in-FOUP metrology, in accordance with one or more embodiments of the present disclosure. Applicant notes that the embodiments and enabling technologies described previously herein in the context of the in-FOUP metrology system 100 should be interpreted to extend to method 400. It is further noted, however, that the method 400 is not limited to the architecture of the in-FOUP metrology system 100.

In one embodiment, the method 400 includes the step 402 of performing a process step on a sample with a process tool. For example, step 402 may include, but is not limited to, a material deposition step, a lithography step, an etching step, a chemical mechanical planarization (CMP) step. By way of another example, step 402 may include a metrology step taken with a stand-alone metrology tool such as, but not limited to, an overlay metrology tool, a critical dimension metrology tool, or an inspection tool.

In another embodiment, the method 400 includes the step 404 of inserting the sample into a sample transport device (e.g., a FOUP). It is recognized herein that FOUPs are commonly used to transport and/or store samples between various process steps in a semiconductor fabrication process. In this regard, the FOUPs may provide a secure means of transporting the samples to prevent breakage. Further, FOUPs may provide and/or maintain a clean environment to protect the samples from particulates or other contamination sources.

In one embodiment, the method 400 includes the step 406 of generating metrology data for the sample with a metrology unit within the sample transport device (e.g., a FOUP).

In another embodiment, the FOUP includes at least one metrology unit configured to perform metrology measurements on samples within the FOUP. The metrology unit (e.g., an in-FOUP metrology system 100 illustrated in FIGS. 1-3) may perform any number of metrology measurements on the sample. Further, the metrology unit may utilize any metrology technique known in the art such as, but not limited to, optical imaging, reflectometry, spectroscopic reflectometry, ellipsometry, or spectroscopic ellipsometry measurements.

In another embodiment, the method may include one or more data processing steps based on the metrology data from step 406. For example, the method may include determining a film thickness of one or more films on the sample. By way of another example, the method may include determining a composition of one or more films on the sample. By way of another example, the method may include determining a size, shape, or orientation of one or more features on the sample. By way of a further example, the method may include identifying and/or classifying one or more defects on the sample.

In another embodiment, the method 400 includes the step 408 of controlling one or more control parameters of at least one of the process tools or an additional process tool based on the metrology data from the sample transport device. For example, the metrology data (or processed metrology data) may be provided to one or more process tools that have previously processed the sample as feedback data. In this regard, operational parameters of the one or more process tools may thus be modified for processing additional samples within the same lot or different lots to mitigate process variations. By way of another example, the metrology data (or processed metrology data) may be provided to one or more process tools as feedforward data. In this regard, operational parameters of the one or more process tools may thus be modified for processing the same sample in future steps to mitigate any measured process variations on previous steps.

In another embodiment, metrology data from in-FOUP metrology may be used as a screening metrology step. For example, in-FOUP metrology may be used to identify process outliers. Samples containing the outliers may then be removed from production or routed to one or more additional process or metrology steps. By way of another example, in-FOUP metrology may be used as a first-stage metrology step. In this regard, in-FOUP metrology may be used to determine when additional metrology (perhaps with a higher resolution or quality than provided by the in-FOUP metrology system 100) is required.

In another embodiment, the method may include utilizing metrology data associated with one or more samples to characterize and/or control process tools. For example, metrology data (or aggregate metrology data over time) may be utilized as diagnostic data for one or more process tools. In this regard, process tools may be monitored by in-FOUP metrology with little to no impact on the throughput of a process line. The diagnostic data may then be used to provide tool qualification, post-installation monitoring, runtime monitoring, tool-to-tool matching, or preventative maintenance recommendations.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
   one or more casings configured to be interchangeably positioned within a set of sample storage features for securing two or more samples in an interior cavity of a portable sample transport device, wherein the portable sample transport device includes an enclosure to fully enclose the set of sample storage features and the one or more casings, wherein the portable sample transport device is configured to mount to a loadport of at least one of a process tool or a buffer station;
   an illumination source within one of the one or more casings;
   one or more illumination optics within one of the one or more casings, the one or more illuminating optics further configured to direct illumination from the illumination source to a sample located within the set of sample storage features in the interior cavity of the sample transport device;
   one or more collection optics within one of the one or more casings, the one or more collection optics further configured to collect light from the sample in response to the illumination from the illumination source; and
   one or more detectors within one of the one or more casings, the one or more detectors configured to generate metrology data based on at least a portion of the light collected by the one or more collection optics.

2. The metrology system of claim 1, wherein the sample transport device comprises:
   a front opening unified pod.

3. The metrology system of claim 1, further comprising:
   a data storage device to store the metrology data.

4. The metrology system of claim 3, further comprising:
   a data transmitter to transmit the metrology data from the data storage device.

5. The metrology system of claim 4, wherein the data transmitter comprises:
   at least one of a wireless transmitter or a wired transmitter.

6. The metrology system of claim 5, wherein the data transmitter transmits the metrology data to the loadport when the enclosure is coupled to the loadport.

7. The metrology system of claim 1, further comprising:
   a data receiver including at least an antenna to receive data from an external source.

8. The metrology system of claim 7, wherein the data received by the external source comprises:
   one or more control instructions for at least one of the illumination source, the one or more illumination optics, the one or more collection optics, or the one or more detectors.

9. The metrology system of claim 1, wherein the metrology data comprises:
   one or more images of the sample.

10. The metrology system of claim 1, wherein the metrology data comprises:
    reflectometry data of the sample.

11. The metrology system of claim 10, wherein the reflectometry data comprises:
    spectroscopic reflectometry data of the sample.

12. The metrology system of claim 1, wherein the metrology data comprises:
    ellipsometry data of the sample.

13. The metrology system of claim 12, wherein the ellipsometry data comprises:
    spectroscopic ellipsometry data of the sample.

14. The metrology system of claim 1, wherein the metrology data comprises:
    defect inspection data of the sample.

15. The metrology system of claim 1, further comprising:
    a controller communicatively coupled to at least the one or more detectors, the controller including one or more processors configured to cause the one or more processors to:
       determine at least one of a film thickness of one or more films on the sample, a composition of one or more films on the sample, or dimensions of one or more features on the sample.

16. The metrology system of claim 1, further comprising:
    a controller communicatively coupled to at least the one or more detectors, the controller including one or more processors configured to cause the one or more processors to:
       provide the metrology data as at least one of feedback data or feedforward data to one or more process tools.

17. The metrology system of claim 1, further comprising:
    a controller communicatively coupled to at least the one or more detectors, the controller including one or more processors configured to cause the one or more processors to:
       provide the metrology data as diagnostic data associated with one or more process tools.

18. The metrology system of claim 17, wherein the one or more processors are further configured to cause the one or more processors to:
    provide the diagnostic data to an electronics manufacturing service.

19. The metrology system of claim 1, further comprising:
    a controller communicatively coupled to at least the one or more detectors, the controller including one or more processors configured to cause the one or more processors to:
       identify one or more defects on the sample.

20. The metrology system of claim 1, further comprising:
a controller communicatively coupled to at least the one or more detectors, the controller including one or more processors configured to cause the one or more processors to:
classify one or more defects on the sample.

21. The metrology system of claim 1, wherein the metrology data comprises:
location-specific data from one or more locations on the sample.

22. A sample transport device comprising:
a portable enclosure configured to mount to a loadport of at least one of a process tool or a buffer station;
a set of sample storage features within the portable enclosure for securing two or more samples in the enclosure;
one or more metrology tools positioned within the set of sample storage features to generate metrology data for at least one of the two or more samples, wherein the portable enclosure fully encloses two or more samples and the one or more metrology tools; and
a data transmitter to transmit the metrology data from the one or more metrology tools.

23. The sample transport device of claim 22, wherein the portable enclosure comprises:
a front opening unified pod.

24. The sample transport device of claim 22, wherein the one or more metrology tools are distributed among the one or more casings in the portable enclosure.

25. The sample transport device of claim 24, wherein the one or more casings are detachable from the portable enclosure.

26. The sample transport device of claim 22, wherein at least one of the one or more metrology tools comprises:
an illumination source configured to direct illumination to a sample of the one or more samples;
collection optics to collect light from the sample in response to the illumination from the illumination source; and
one or more detectors configured to generate the metrology data based on the light collected from the sample.

27. The sample transport device of claim 26, wherein at least one of the one or more metrology tools comprises:
an optical imaging system configured to generate one or more images of at least one of the one or more samples in the portable enclosure.

28. The sample transport device of claim 26, wherein at least one of the one or more metrology tools comprises:
a reflectometry system to generate reflectometry data for at least one of the one or more samples using one or more wavelengths from the illumination source.

29. The sample transport device of claim 26, wherein at least one of the one or more metrology tools comprises:
an ellipsometry system to generate ellipsometry data for at least one of the one or more samples using one or more wavelengths from the illumination source.

30. The sample transport device of claim 22, wherein at least one of the one or more metrology tools comprises:
a defect inspection system to identify one or more defects on a sample of the one or more samples in the enclosure.

31. The sample transport device of claim 22, wherein the one or more metrology tools comprise:
two or more metrology tools.

32. The sample transport device of claim 22, further comprising:
a controller communicatively coupled to at least the one or more detectors, the controller including one or more processors configured to cause the one or more processors to:
determine at least one of a film thickness of one or more films on a sample of the one or more samples, a composition of one or more films on the sample, or dimensions of one or more features on the sample.

33. The sample transport device of claim 22, further comprising:
a controller communicatively coupled to at least the one or more detectors, the controller including one or more processors configured to cause the one or more processors to:
provide the metrology data as at least one of feedback data or feedforward data to one or more process tools.

34. The sample transport device of claim 22, further comprising:
a controller communicatively coupled to at least the one or more detectors, the controller including one or more processors configured to cause the one or more processors to:
provide the metrology data as diagnostic data associated with one or more process tools.

35. The sample transport device of claim 22, wherein the data transmitter comprises:
at least one of a wired transmitter or a wireless transmitter.

36. The sample transport device of claim 22, wherein the data transmitter transmits the metrology data to the loadport when the enclosure is coupled to the loadport.

37. The sample transport device of claim 22, wherein the portable enclosure includes one or more components to couple with an automated handling system for transport.

38. A metrology method comprising:
performing a process step on a sample with a first process tool;
inserting the sample into a set of sample storage features for securing two or more samples in an interior cavity of a portable sample transport device;
transporting the sample to a second process tool in the portable sample transport device;
generating metrology data for the sample with a metrology tool positioned within one or more casings configured to be interchangeably positioned within the set of sample storage features in the portable sample transport device, wherein the portable sample transport device fully encloses the sample and the metrology tool; and
controlling one or more control parameters of the second process tool based on the metrology data from the portable sample transport device.

39. The metrology method of claim 38, further comprising:
controlling one or more control parameters of the first process tool with the metrology data as at least one of feedback data or feedforward data.

* * * * *